United States Patent [19]

Kirsch et al.

[11] Patent Number: 5,432,731

[45] Date of Patent: Jul. 11, 1995

[54] FERROELECTRIC MEMORY CELL AND METHOD OF SENSING AND WRITING THE POLARIZATION STATE THEREOF

[75] Inventors: Howard C. Kirsch; Papu D. Maniar, both of Austin, Tex.

[73] Assignee: Motorola, Inc., Schaumburg, Ill.

[21] Appl. No.: 28,915

[22] Filed: Mar. 8, 1993

[51] Int. Cl.$^6$ .............................. G11C 11/22
[52] U.S. Cl. ...................... 365/145; 365/65; 365/149; 327/49; 327/51
[58] Field of Search ............... 365/145, 149, 207, 222, 365/65; 327/49, 51

[56] References Cited

U.S. PATENT DOCUMENTS

| | | | |
|---|---|---|---|
| 4,873,664 | 10/1989 | Eaton, Jr. | 365/145 |
| 4,888,733 | 12/1989 | Mobley | 365/145 |
| 4,893,272 | 1/1990 | Eaton, Jr. et al. | 365/145 |
| 5,031,143 | 7/1991 | Jaffe, Jr. | 365/145 |
| 5,086,412 | 2/1992 | Jaffe et al. | 365/145 |
| 5,218,566 | 6/1993 | Papaliolios | 365/149 |
| 5,237,533 | 8/1993 | Papaliolios | 365/145 |

Primary Examiner—Joseph A. Popek
Assistant Examiner—Tan Nguyen
Attorney, Agent, or Firm—Eugene A. Parsons

[57] ABSTRACT

A memory cell containing a ferroelectric capacitor the memory state of which is sensed by cycling the potential across the capacitor from zero, through an upper electric field point and back to zero. If the cell was residing in the upper permanent remnant polarization point, a low change in charge flow occurs and if the cell was residing in the lower permanent remnant polarization point, a low (near zero) change in charge flow occurs. This change in charge flow from a near zero value to a large amount allows a very accurate reference capacitor to be used for the comparison or sensing process.

8 Claims, 3 Drawing Sheets

FERROELECTRIC MEMORY CELL AND METHOD OF SENSING AND WRITING THE POLARIZATION STATE THEREOF

FIELD OF THE INVENTION

The present invention pertains to ferroelectric memory cells and more specifically to an improved method of sensing the polarization state of ferroelectric memory cells.

BACKGROUND OF THE INVENTION

A basic ferroelectric non-volatile memory cell includes, as the major memory component, a capacitor with a dielectric which is ferroelectric material. By definition, the ferroelectric material has a permanent polarization, i.e., a non-zero internal polarization with no applied electric field. Hereinafter the term zero electric field includes no applied electric field, a zero applied electric field, or any other situation in which the resulting external electric field on the ferroelectric material is zero.

In some prior art ferroelectric memory cells pairs of ferroelectric capacitors and pairs of switching transistors are utilized. In these devices the pairs of capacitors are normally in complimentary polarization states and, thus, the states are determined by comparing the state of one of the capacitors of the pair of capacitors to the state of the other capacitor. This memory cell has the disadvantage of requiring a substantially larger number of components, which increases the size and cost of the structure.

A major problem in sensing the polarization state of the ferroelectric capacitor in a single capacitor memory cell is the fact that the electric field/polarization characteristic loop (hysterisis curve) of a ferroelectric capacitor changes over time, due to ageing from use or due to ageing from being left in a polarization state for an extended time. Generally, this change in polarization properties with time, results in a collapsing of the hysterisis curve. This is a basic materials phenomena which is due to a non-reversibility in at least a portion of the volume of the ferroelectric material under electric field/polarization cycling. This changing of the ferroelectric material makes it very difficult to use a conventional reference cell strategy to determine the polarization state of ferroelectric memory cells.

SUMMARY OF THE INVENTION

It is a purpose of the present invention to provide a new and improved method of sensing the polarization state of the ferroelectric capacitor in a memory cell.

It is a further purpose of the present invention to provide a new and improved method of sensing the polarization state of the ferroelectric capacitor in a memory cell, which maintains its accuracy over time dependent changes.

The above problems and others are solved and the above purposes are realized through a method of sensing the polarization state of a ferroelectric memory cell including a ferroelectric capacitor having a hysterisis curve with upper and lower electric field points and upper and lower permanent remnant polarization points, the method including the steps of applying an electric field to the ferroelectric capacitor, which electric field is cycled from zero to substantially one of the upper and lower electric field points and back to zero, and measuring a net change in polarization. The major advantage arises because any reference cell utilized during the measuring step can be fixed.

BRIEF DESCRIPTION OF THE DRAWING

Referring to the drawings.

DESCRIPTION OF THE PREFERRED EMBODIMENT

Various ferroelectric materials are known, such as Phase III potassium nitrate, bismuth titanate and the PZT family of lead zirconate and titanate compounds. One character of ferroelectric materials is a hysterisis curve or loop of the type illustrated in FIG. 1, wherein the abscissa represents the external electric field, which is proportional to the voltage applied to the material and the ordinate represents the polarization of the ferroelectric material. That is, because of the hysterisis curve, if a capacitor is formed using a ferroelectric material between its plates, the flow of current through the capacitor depends on the prior history of voltages applied to the capacitor. If a ferroelectric capacitor is in an initial state wherein zero volts is applied, it may have a polarization indicated at point A in FIG. 1. When sufficient positive voltage is applied across the capacitor, internal charges flow and it moves to a new polarization represented by point C. When the applied voltage is reduced to zero, the ferroelectric material of the capacitor moves to the polarization state represented by point D (rather than returning to point A) as indicated by the arrowheads in the hysterisis curve. Any additional positive voltage causes relatively little change in the polarization, simply moving it back to, or beyond, point C. However, a sufficiently large negative voltage causes the polarization to move to state F and a subsequent move to state A when the negative voltage is removed. Thus, points A and D represent two stable states, or lower and upper permanent remnant polarization points, P(A) and P(D), respectively, occurring at zero applied volts but depending upon the history of voltage applied to the capacitor. Points C and F represent upper and lower electric field points E(C) and E(F)

To use the ferroelectric capacitor as the storage element in a memory cell, circuitry is provided to differentiate unambiguously between the two stable states A and D in the capacitor. A conventional technique for converting the polarization state to an electrically measurable quantity is performed in two steps. First, the electric field across the capacitor is changed from zero to approximately E(C) by changing the voltage across the capacitor by means of an external circuit. Second, the charge, $\Delta Q$, that flows through the external circuit as a result of the change, $\Delta E$, in the electric field, is measured. The charge flow is made to cause a change in voltage on a capacitance in the external circuit, which change in voltage is then sensed by a voltage amplifier.

Figure 1:
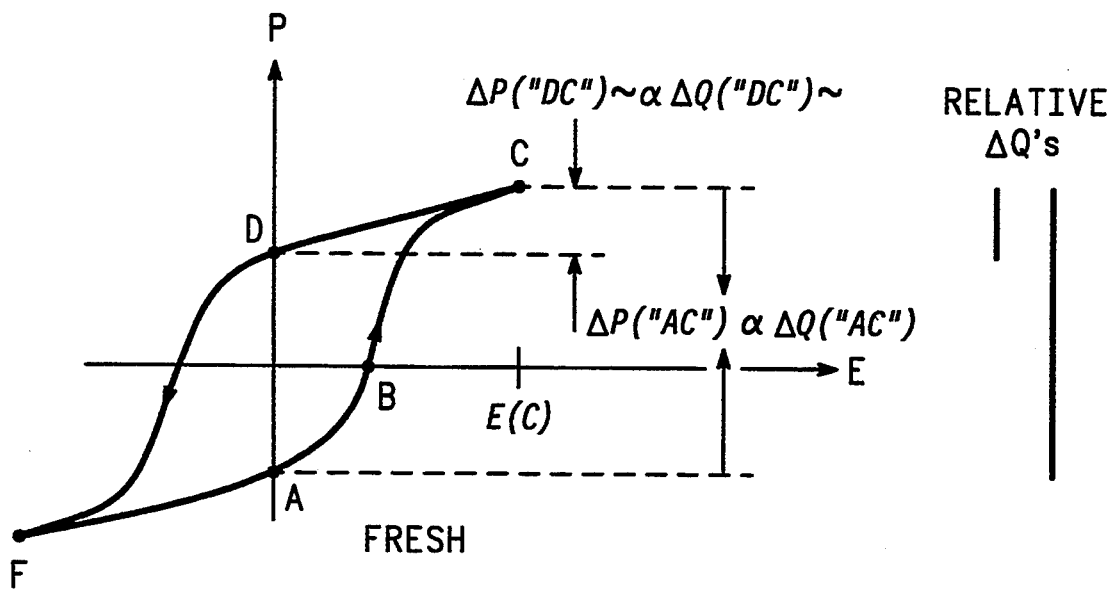
FIG. 1 illustrates a hysterisis curve for a ferroelectric capacitor.

Gauss' law shows that $\Delta Q$ is proportional to the net change in polarization, $\Delta p$. Referring to FIG. 1, it can be seen that $\Delta P$ is larger for the transition from state A to state C than for the transition from state D to state C, which means that ΔQ(AC) is also larger than ΔQ(DC). The problem is unambiguously differentiating between ΔQ(AC) and ΔQ(DC).

Figure 2:
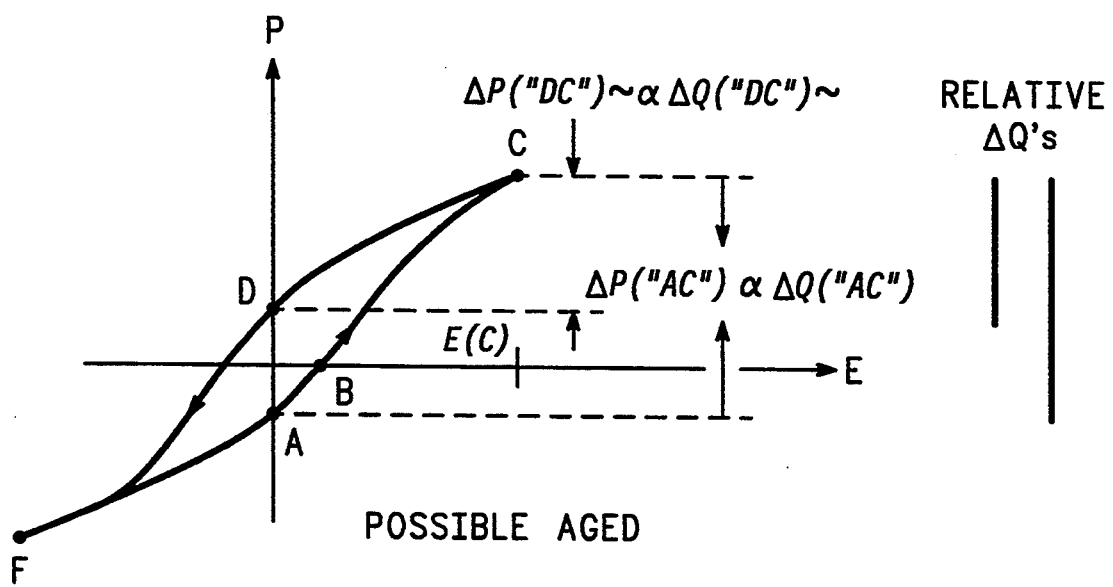
FIG. 2 illustrates a hysterisis curve for a cycled ferroelectric capacitor.

A major problem in sensing the polarization state of the ferroelectric capacitor in a single capacitor memory cell is the fact that the electric field/polarization characteristic loop (hysterisis curve) of a ferroelectric capacitor changes over time, due to ageing or fatigue. Generally, this ageing with use, results in a collapsing of the hysterisis curve, as illustrated in FIG. 2, with repeatedly cycling of the ferroelectric capacitor. As can be seen from a comparison of FIGS. 1 and 2, the amplitudes of both ΔQ(AC) and ΔQ(DC) have been substantially reduced. Note that they are not in general reduced in a fixed proportion. In general, the distortion or collapsing of the hysterisis loop with cycling depends on detailed physical and structural factors of the ferroelectric film and is not necessarily accurately predictable or reproducible. Further, due to the random access nature of most ferroelectric memory cells, different cells are cycled different amounts. Thus, any optimal reference voltage or cell utilized to differentiate between ΔQ(AC) and ΔQ(DC) differs from cell to cell as well as from cycle to cycle. This changing, due to ageing or fatigue, of the ferroelectric material makes it very difficult to use a reference cell to determine the polarization state of ferroelectric memory cells.

Figure 3:
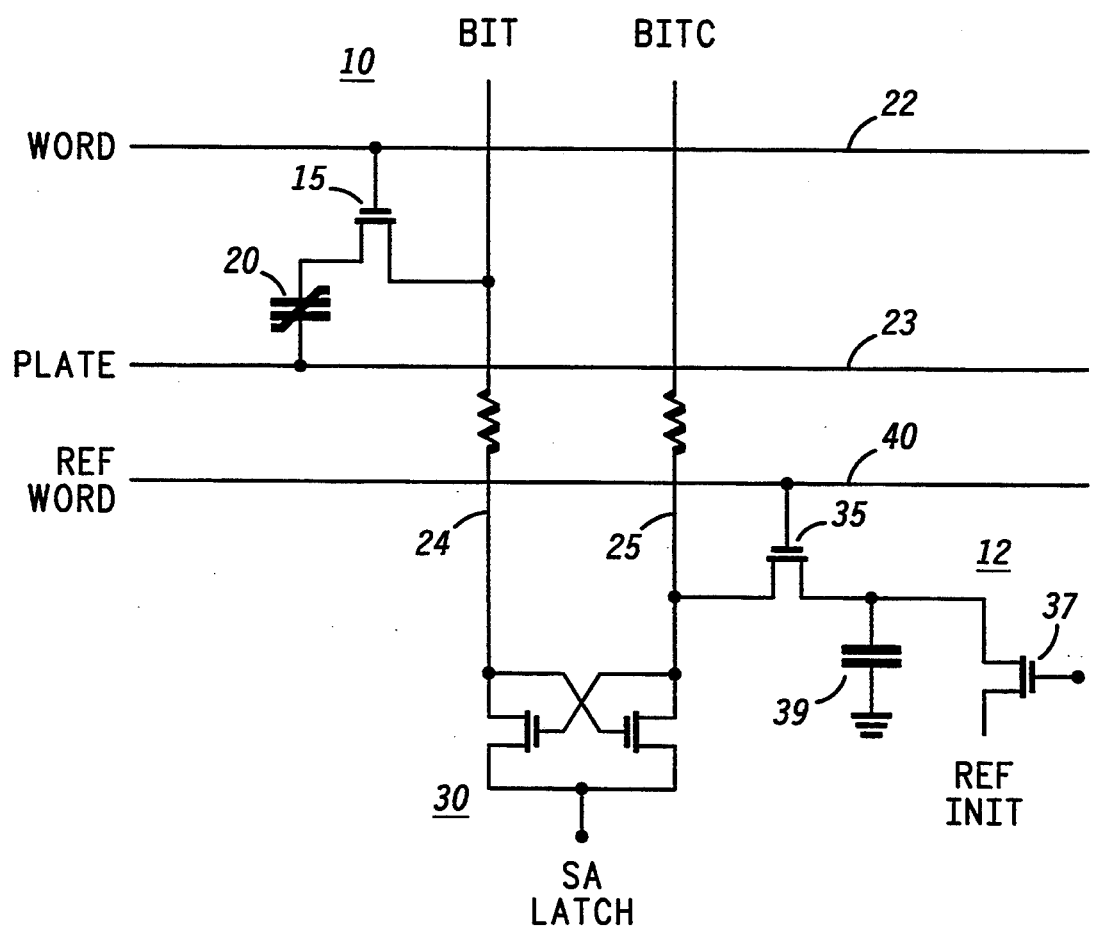
FIG. 3 illustrates a simplified one capacitor ferroelectric memory cell with reference cell.

Referring specifically to FIG. 3, a simplified one capacitor ferroelectric memory cell 10 with an associated reference cell 12 is illustrated. Memory cell 10 includes a single switching transistor 15 and a ferroelectric capacitor 20. Generally, to form an array of memory cells, additional memory cells are provided in a first horizontal row including memory cell 10. The first row containing memory cell 10 has a WORD line 22 and a PLATE line 23 associated therewith. Additional horizontal rows (not shown) parallel therewith and each including a WORD line and a plate line are provided. Also, memory cell 10 is arranged in a first vertical column with additional memory cells (not shown) having a common BIT line pair 24, 25 connected to a sense amplifier, or latch, 30. Additional columns, each having common BIT line pairs and sense amplifiers are also provided in the array. BIT line 24 is connected to memory cell 10 and to all other memory cells in the first column while BIT line 25 is connected to reference cell 12.

WORD line 22 is connected to the gate of switching transistor 15, and to the gate of switching transistors in each other memory cell in the first row. PLATE line 23 is connected to one plate of ferroelectric capacitor 20, the other plate of which is connected to the drain of switching transistor 15. PLATE line 23 is similarly connected to other memory cells in the first row. The source of switching transistor 15 is connected to BIT line 24 and the sources of switching transistors in all other memory cells in the first column are connected to BIT line 24.

Reference cell 12 is associated with all of the memory cells in the first column. One advantage of the present invention is the fact that a single reference cell can be used with any memory cell, which allows the use of a single reference cell with each column. Reference cell 12 includes a first switching transistor 35, a second switching transistor 37 and a reference capacitor 39. The gate of switching transistor 35 is connected to a REF WORD line 40 and the source is connected to BIT line 25. One plate of reference capacitor 39 is connected to ground and the other plate is connected to the drain of switching transistor 35 and to the source of switching transistor 37. The drain of switching transistor 37 is connected to a reference potential and the gate is connected to receive a reference initialize signal.

Sense amplifier 30 is connected to both BIT lines 24 and 25 and is designed to sense the difference between voltages on ferroelectric capacitor 20 (when memory cell 10 is accessed) and reference capacitor 39. Generally, any differential amplifier or amplifier setting up a "race" condition between two BIT lines (e.g., 24 and 25) or other types of amplifiers which sense a greater voltage or current on one of the two lines can be used as sense amplifier 30.

Figure 4:
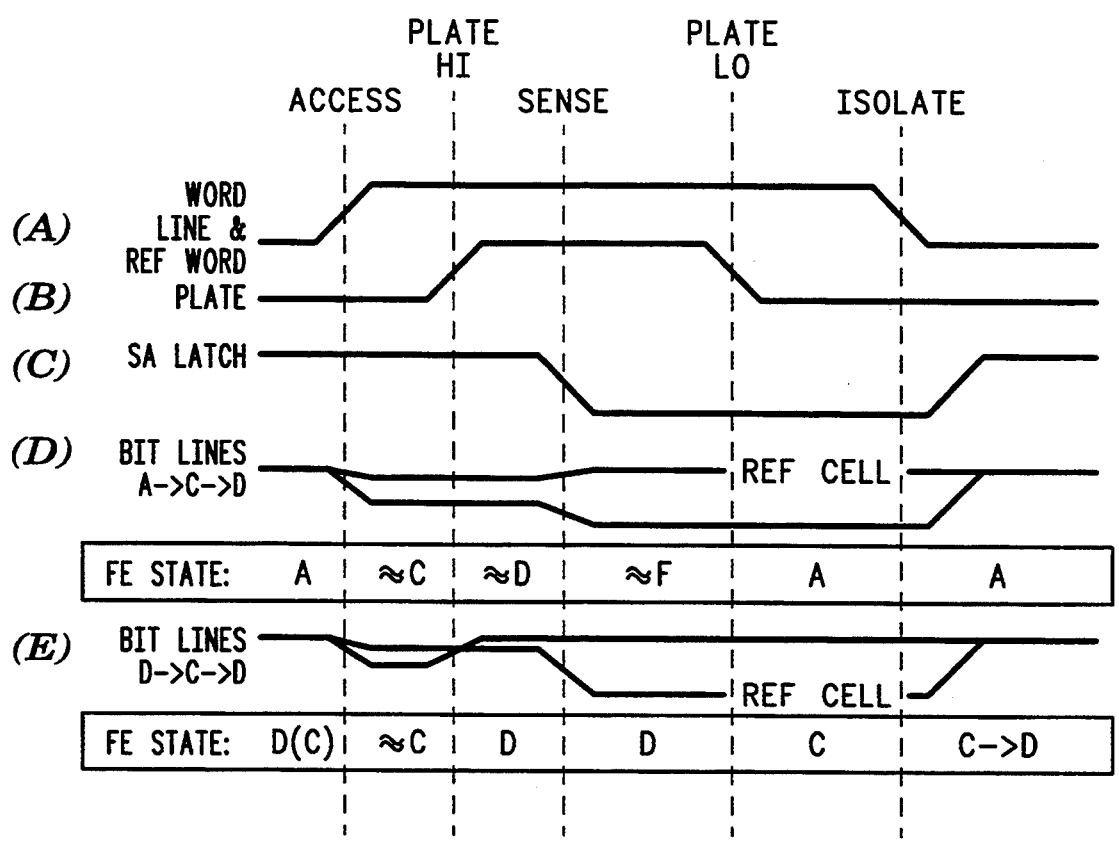
FIG. 4 illustrates various voltage waveforms for the circuitry of FIG.3.

To understand the operation of a ferroelectric memory cell operated in accordance with the present invention, an explanation of memory cell 10 of FIG. 3 is provided, along with references to various voltage waveforms illustrated in FIG. 4. Memory cell 10 stores data, in the form of a logic high or a logic low signal, in ferroelectric capacitor 20. BIT lines 24 and 25 are coupled to complimentary outputs of sense amplifier 30. If the stored binary data is a logic "one" (a logical high), then ferroelectric capacitor 20 is in one polarization state (A or D in FIG. 1), whereas if the stored binary data is a logic "zero" (a logical low) ferroelectric capacitor 20 is in the opposite state. Assume the stored data is a logic zero and that ferroelectric capacitor 20 is at state A.

To access memory cell 10 and sense its stored data, a positive signal is applied to WORD line 22 and to REF WORD line 40 (see waveform A. in FIG. 4). The initial voltage on PLATE line 23 is low. An SA LATCH signal on sampling amplifier 30 has a normally high signal applied thereto (as illustrated in waveform C. of FIG. 4) and BIT lines 24 and 25 are in a normally high state (as illustrated in waveform D. of FIG. 4). As a result of these signals, transistor 15 is turned ON and a positive voltage is applied across ferroelectric capacitor 20 from high BIT line 24 to low PLATE line 23. Because ferroelectric capacitor 20 is in state A, a relatively large charge flows as the ferroelectric material moves from state A to state C. BIT line 24, coupled to ferroelectric capacitor 20 through the source-drain path of switching transistor 15, is drawn lower by the state change. Simultaneously, the positive signal on REF WORD line 40 turns on transistor 35 so that BIT line 25 is moved lower proportional to the charge stored in reference capacitor 39.

At some later time (generally later by one internally timed clock period), a positive signal is applied to PLATE line 23 (see waveform B. in FIG. 4). The positive signal on PLATE line 23 and on BIT line 24 results in essentially zero voltage being applied across ferroelectric capacitor 20 and the ferroelectric material drops back to the D state. The charge displacement produced by ferroelectric capacitor 20 moving from the C state to the D state increases the potential on BIT line 24 as illustrated in waveform D of FIG. 4.

At a still later time (one clock pulse), a low signal (see waveform C of FIG. 4) is applied to the LATCH terminal of sense amplifier 30, which completes a current path through the complimentary connected pair of transistors in sense amplifier 30 and allows conduction thereof. Since the more positive signal is on BIT line 25, from reference cell 12, the gate of the left transistor of the complimentary pair in sense amplifier 30 will be more positive and cause the left transistor to conduct more current and eventually shut off the right transistor (see waveform D in FIG. 4). Thus, BIT line 25 will be latched in a high state and BIT line 24 will be latched in a low state.

During the read operation, ferroelectric capacitor 20 is charged to the D state and must now be returned to its original state A. This is accomplished automatically when the low signal is applied to the LATCH terminal of sense amplifier 30 and BIT line 24 goes low. Under these conditions, a positive voltage is being applied across ferroelectric capacitor 20 in the opposite direction and the ferroelectric material is driven to the state F (see FIG. 1). At a later time the positive signal is removed from PLATE line 23 and the voltage is removed from ferroelectric capacitor 20, which causes it to drop back to state A. It should be noted that this change of states of ferroelectric capacitor 20 has no effect on the status of BIT lines 24 and 25, which are latched in the sense position until after the positive signals are removed from WORD line 22 and REF WORD line 40.

Assuming that ferroelectric capacitor 20 is originally in state D, as a result of the positive signals on WORD line 22 and REF WORD line 40, transistor 15 is turned ON and a positive voltage is applied across ferroelectric capacitor 20 from high BIT line 24 to low PLATE line 23. Because ferroelectric capacitor 20 is in state D, a relatively small charge flows as the ferroelectric material moves from state D to state C. PLATE line 23 is turned on, essentially removing the charge from across ferroelectric capacitor 20 and allowing ferroelectric capacitor 20 to return to the D state. The reference cell is accessed as before, resulting in BIT line 25 being moved lower in voltage. The reference cell is sized so that, in this state of ferroelectric capacitor 20, BIT line 25 is at a lower voltage than BIT line 24. Sense amplifier 30 is turned ON and detects the difference in voltages between BIT lines 24 and 25, which difference latches sense amplifier in the other of the two possible modes. Simultaneously, the high potential on BIT line 24 and the high potential on PLATE line 23 are applied across ferroelectric capacitor 20, which retains ferroelectric capacitor 20 in its original D state. After the voltage on WORD line 22 is dropped to zero, sense amplifier 30 is deactivated and BIT lines 24 and 25 are deactivated.

Thus, in simplified terms, the electric field across ferroelectric capacitor 20 is cycled from zero to E(C) and back to zero before measuring ΔQ. Thus, when the ferroelectric material of ferroelectric cell 20 is in state A, the cycling will cause the ferroelectric material to move from state A to state C and then to state D. The result of these state changes is a net change in polarization of P(D)-P(A). However, when the ferroelectric material of ferroelectric cell 20 is originally in state D, the cycling will cause the ferroelectric material to move from state D to state C and then back to state D. The net change in polarization for these state changes is nominally zero. In reality, because of potential non-idealities and time-dependent relaxation effects, this net change is close to, but not exactly, zero.

From this description it can be seen that this method provides the advantage of needing to differentiate between a substantial signal (A>C>D) and a nearly zero signal (D>C>D), rather than between two different and variable sized nonzero signals which change independently of each other and vary from cell to cell based on prior history as must be done in many other memory cells. This allows the reference level of sense amplifier 30, and for cell relaxation effects, to be set more accurately and to optimize the sensing system around the characteristics of the ferroelectric material. Further, reference cell 12 can be a linear or ferroelectric cell designed to provide a signal at BIT line 25 which is equal to the largest postulated D>C>D polarization change plus a margin for worst case imbalance of sense amplifier 30. As an example, for CMOS this imbalance (at 1σ) is a few tens of millivolts and for bipolar the imbalance is single digit millivolts. As a general rule, but not an absolute limitation, as long as the minimum signal from the ferroelectric cell for a polarization change of A>C>D is more than twice the amount of the signal from the reference cell, the sensing system will remain accurate.

While the present disclosure has been limited to a description wherein the ferroelectric capacitor is cycled through A>C>D or D>C>D, it will be seen by those skilled in the art that a system could be devised (generally by reversing the voltage polarities) wherein the ferroelectric capacitor is cycled through D>F>A or A>F>A. The net polarization change for such a system generally remains the same as the described system and the operation would be similar.

Thus, a new and improved method of sensing the polarization state of the ferroelectric capacitor in a memory cell has been disclosed. The new and improved method maintains its accuracy over ageing or fatigue of the ferroelectric material and allows the use of different and simplified reference cells (linear or ferroelectric cell design). That is, because of the novel method a single memory cell can be utilized which is set more accurately and which is set to optimize the sensing system around the characteristics of the ferroelectric material. Thus, a new and more accurate memory cell is also disclosed.

While we have shown and described specific embodiments of the present invention, further modifications and improvements will occur to those skilled in the art. We desire it to be understood, therefore, that this invention is not limited to the particular forms shown and we intend in the append claims to cover all modifications that do not depart from the spirit and scope of this invention.

What is claimed is:

1. A method of sensing the polarization state of a ferroelectric memory cell comprising the steps of:
   providing a ferroelectric memory cell including a switching device and a ferroelectric capacitor with first and second terminals and having a hysterisis curve with upper and lower electric field points and upper and lower permanent remnant polarization points;
   providing a reference cell with a switching circuit and a reference capacitor and storing a reference charge therein;
   providing first and second bit lines connected to differentially connected output terminals of a sense amplifier;
   connecting the first terminal of the ferroelectric capacitor to the first bit line by activating the switching device and connecting the reference capacitor to the second bit line by activating the switching circuit;
   applying an electric field to the second terminal of the ferroelectric capacitor to cycle the electric field from substantially zero to substantially one of the upper and lower electric field points and produce a charge flow, which charge flow is a first amount when the ferroelectric capacitor resides in the upper permanent remnant polarization point and a second amount when the ferroelectric capacitor resides in the lower permanent remnant polarization point;

activating the sense amplifier to compare the charge flow produced by cycling the electric field to the reference charge stored in the reference capacitor to determine whether the charge flow is the first or second amount;

removing the electric field; and deactivating the sense amplifier to refresh the ferroelectric capacitor.

2. A method of sensing the polarization state of a ferroelectric memory cell as claimed in claim 1 wherein the step of storing a reference charge in the reference capacitor includes the steps of determining approximately the largest second amount of charge flow that can occur, determining the largest errors that can occur in the comparing step and setting the stored reference charge greater than the combination of the determined largest second amount and the largest errors.

3. A method of sensing the polarization state of a ferroelectric memory cell as claimed in claim 1 wherein the step of providing a reference cell with a reference capacitor includes providing a reference cell with one of a ferroelectric capacitor and a linear capacitor.

4. A ferroelectric memory cell and associated reference cell comprising:

a ferroelectric memory cell including a switching device and a ferroelectric capacitor with first and second terminals, the ferroelectric capacitor having a hysterisis curve with upper and lower electric field points and upper and lower permanent remnant polarization points the upper and lower permanent remnant polarization points being stable operating points;

a reference cell having a switching circuit and a reference capacitor;

a sense amplifier having an activating input terminal and a pair of differentially connected output terminals;

first and second bit lines connected to the differentially connected output terminals of the sense amplifier, the switching device of the ferroelectric memory cell connecting the first terminal of the ferroelectric capacitor to the first bit line when activated and the switching circuit of the reference cell connecting the reference capacitor to the second bit line when activated; and an electric potential input line attached to the second terminal of the memory cell for cycling the ferroelectric capacitor between substantially zero electric potential thereacross, an electric potential sufficient to move the polarization to one of the upper and lower electric field points and back to substantially zero electric potential such that upon sequentially activating the switching device and switching circuit, applying an electric potential to the electric potential line to activate the sense amplifier, removing the electric potential to move the polarization of the ferroelectric capacitor back to substantially zero electric potential and deactivating the sense amplifier the ferroelectric cell is sensed and refreshed.

5. A ferroelectric memory cell and associated reference cell as claimed in claim 4 wherein the electric potential input line attached to the memory cell for cycling the ferroelectric capacitor is designed to receive an electric potential which cycles the ferroelectric capacitor between substantially zero electric potential, an electric potential sufficient to move the polarization to the upper electric field point and back to substantially zero electric potential.

6. A ferroelectric memory cell and associated reference cell as claimed in claim 4 wherein the electric potential input line attached to the memory cell for cycling the ferroelectric capacitor is designed to receive an electric potential which cycles the ferroelectric capacitor between substantially zero electric potential, an electric potential sufficient to move the polarization to the lower electric field point and back to substantially zero electric potential.

7. A ferroelectric memory cell and associated reference cell as claimed in claim 4 wherein the reference capacitor is designed to provide an electric charge which is equal to a largest postulated polarization change of the ferroelectric capacitor plus a margin for worst case imbalance of the means for comparing.

8. A ferroelectric memory cell and associated reference cell as claimed in claim 4 wherein the reference capacitor includes one of a ferroelectric capacitor and a linear capacitor.

* * * * *